US007315928B2

(12) United States Patent
Chen et al.

(10) Patent No.: US 7,315,928 B2
(45) Date of Patent: Jan. 1, 2008

(54) APPARATUS AND RELATED METHOD FOR ACCESSING PAGE MODE FLASH MEMORY

(75) Inventors: Wei-Jen Chen, Taipei-Hsien (TW); Chung-Hung Tsai, Hsin-Chu Hsien (TW)

(73) Assignee: MediaTek Incorporation, Hsin-Chu Hsien (TW)

( * ) Notice: Subject to any disclaimer, the term of this patent is extended or adjusted under 35 U.S.C. 154(b) by 350 days.

(21) Appl. No.: 10/906,102

(22) Filed: Feb. 3, 2005

(65) Prior Publication Data

US 2006/0174057 A1 Aug. 3, 2006

(51) Int. Cl.

| | |
|---|---|
| ***G06F 12/00*** | (2006.01) |
| ***G06F 13/00*** | (2006.01) |
| ***G06F 13/28*** | (2006.01) |
| *G06F 3/00* | (2006.01) |
| *G06F 1/12* | (2006.01) |
| *G06F 13/42* | (2006.01) |
| *G06F 5/00* | (2006.01) |
| *G06F 7/00* | (2006.01) |
| *G06F 1/00* | (2006.01) |

(52) U.S. Cl. ...................... 711/167; 711/103; 711/154; 710/29; 713/400; 713/401; 713/501

(58) Field of Classification Search ................ 711/103, 711/167

See application file for complete search history.

(56) References Cited

U.S. PATENT DOCUMENTS 6,128,716 A * 10/2000 Biggs ........................ 711/169
2001/0042174 A1 11/2001 Anurag
2006/0174057 A1 * 8/2006 Chen et al. ................ 711/103

OTHER PUBLICATIONS

AMD, "Understanding Page Mode Flash Memory Devices", May 25, 2000, pp. 1-5.*

* cited by examiner

*Primary Examiner*—Donald Sparks
*Assistant Examiner*—Ryan Bertram
(74) *Attorney, Agent, or Firm*—Winston Hsu

(57) ABSTRACT

A method of controlling an access time for accessing a flash memory comprises comparing a target address of the flash memory with an address of the flash memory that was previously accessed; setting the access time for the flash memory to be a first access time if the target address does not correspond to the same page of the flash memory as the previous address; and setting the access time for the flash memory to be a second access time if the target address corresponds to the same page of the flash memory as the previous address, the first access time being greater than the second access time.

14 Claims, 9 Drawing Sheets

Start 50
IDLE ; keep flash CE/OE de-active 52
Access flash? 54
N
Y
$t_{ACC}$ & $t_{PACC}$ setup OK? 56
N
Access flash access time is $t_{INIT}$ 58
Y
CE active? 60
N
Y
Address at the same page as previous access? 62
N
Access flash access time is $t_{ACC}$ 64
Y
Access flash access time is $t_{PACC}$ 66

| | Page mode flash | Standard flash |
|---|---|---|
| Byte 0 | 90 ns($t_{ACC}$) | 90 ns($t_{ACC}$) |
| Byte 1 | 30 ns($t_{PACC}$) | 90 ns |
| Byte 2 | 30 ns | 90 ns |
| Byte 3 | 30 ns | 90 ns |
| Byte 4 | 30 ns | 90 ns |
| Byte 5 | 30 ns | 90 ns |
| Byte 6 | 30 ns | 90 ns |
| Byte 7 | 30 ns | 90 ns |
| Total time | 300 ns | 720 ns |

Fig. 1 Related Art

APPARATUS AND RELATED METHOD FOR ACCESSING PAGE MODE FLASH MEMORY

BACKGROUND

The invention relates to flash memory, and more specifically, to an apparatus and method for accessing page mode flash memory.

Currently, typical standard flash memory operates with random access times of about 70-90 ns. Please refer to FIG. 1. FIG. 1 is a table comparing access times for page mode flash memory and standard flash memory. When accessing a byte or word of data in standard flash memory, the time required for accessing each byte is the same. In FIG. 1, the access time $t_{ACC}$ for each byte of standard flash is 90 ns. Even when accessing multiple bytes of memory in the same page of the standard flash memory, the access the access time for each byte of memory still remains the same.

To enhance the performance of flash memory, some flash manufactures, such as AMD®, have come up with an approach called page mode flash memory. Unlike standard flash memory having the same access times for every byte or word, page mode flash offers reduced access times when accessing multiple bytes or words within the same page of memory. As shown in FIG. 1, the access time $t_{ACC}$ required for reading the first byte in a page of memory is comparable to the amount of time required in standard flash. However, when accessing other bytes in the same page of the page mode flash memory, the access time $t_{PACC}$ is significantly lower than the access time $t_{ACC}$ for the first byte of memory.

Please refer to FIG. 2. FIG. 2 is a block diagram of a conventional flash memory access system 10. The system 10 contains a microprocessor 12 connected to a standard flash memory 16. Traditional microprocessors do not support different access times, and therefore they cannot take advantage of page mode flash. As an example, the microprocessor 12 shown in FIG. 2 is the Intel® 8032 microprocessor. The microprocessor 12 sends address information to a latch 14 and sends address and data information to the flash memory 16. The microprocessor 12 outputs an address latch enable single ALE for latching the address in the latch 14, and outputs a program strobe enable signal PSEN for reading data from the flash memory 16.

Please refer to FIG. 3. FIG. 3 shows a timing diagram of the flash memory access system 10 reading from standard flash memory 16. Multiple addresses Aa, Ab, and Ac corresponding to bytes of the same page of the flash memory 16 are accessed, but the access times $t_{ACC}$ are the same for each byte of data accessed by the microprocessor 12. Even if the standard flash memory 16 is replaced with page mode flash memory, the microprocessor 12 of the conventional flash memory access system 10 is unable to adjust the access times used for accessing multiple bytes of data within the same page of memory.

SUMMARY

An access system for a flash memory, a flash controller coupled to an internal bus of an integrated circuit, and a method of controlling an access time for accessing a flash memory are provided.

An exemplary embodiment of a method of controlling an access time for accessing a flash memory is disclosed. The method comprises comparing a target address of the flash memory with an address of the flash memory that was previously accessed; setting the access time for the flash memory to be a first access time if the target address does not correspond to the same page of the flash memory as the previous address; and setting the access time for the flash memory to be a second access time if the target address corresponds to the same page of the flash memory as the previous address, the first access time being greater than the second access time.

An exemplary embodiment of an access system for a flash memory is disclosed. The access system comprises a page address register for storing an address of the flash memory that was previously accessed; a page address comparator for comparing a target address of the flash memory with the previous address stored in the page address register; and a timing controller for setting an access time for the flash memory to be a first access time if the target address does not correspond to the same page of the flash memory as the previous address and for setting the access time for the flash memory to be a second access time if the target address corresponds to the same page of the flash memory as the previous address, the first access time being greater than the second access time.

An exemplary embodiment of a flash controller coupled to an internal bus of an integrated circuit is disclosed. The flash controller comprises a flash address generator; a chip enable signal generator; an output enable signal generator; a page address register for storing an address of the flash memory that was previously accessed; a page address comparator for comparing a target address of the flash memory with the previous address stored in the page address register; and a timing controller for setting an access time for the flash memory to be a first access time if the target address does not correspond to the same page of the flash memory as the previous address and for setting the access time for the flash memory to be a second access time if the target address corresponds to the same page of the flash memory as the previous address, the first access time being greater than the second access time.

BRIEF DESCRIPTION OF DRAWINGS

FIG. 1 is a table comparing access times for page mode flash memory and standard flash memory.

DETAILED DESCRIPTION

Figure 2:
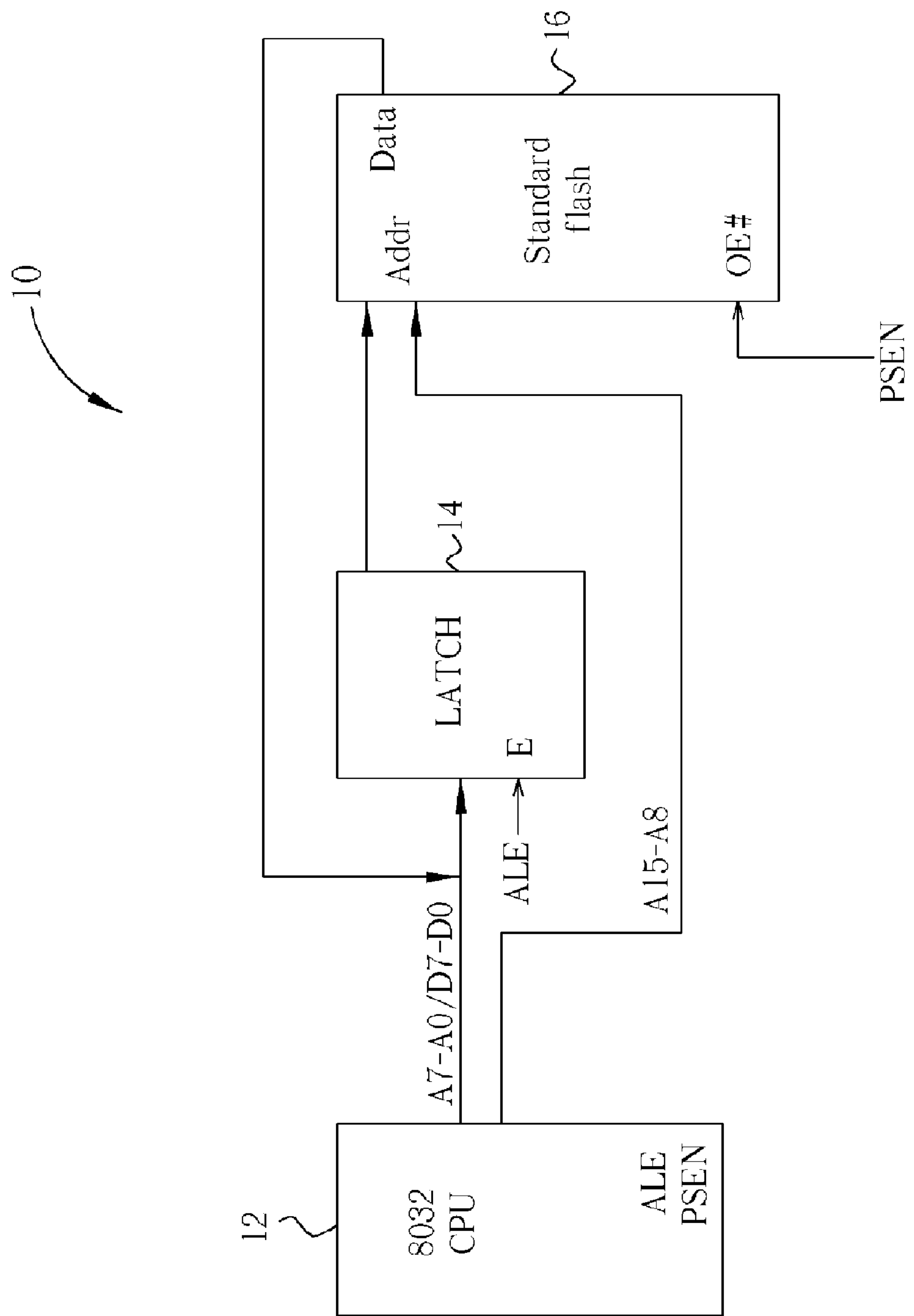
FIG. 2 is a block diagram of a conventional flash memory access system.
Figure 3:
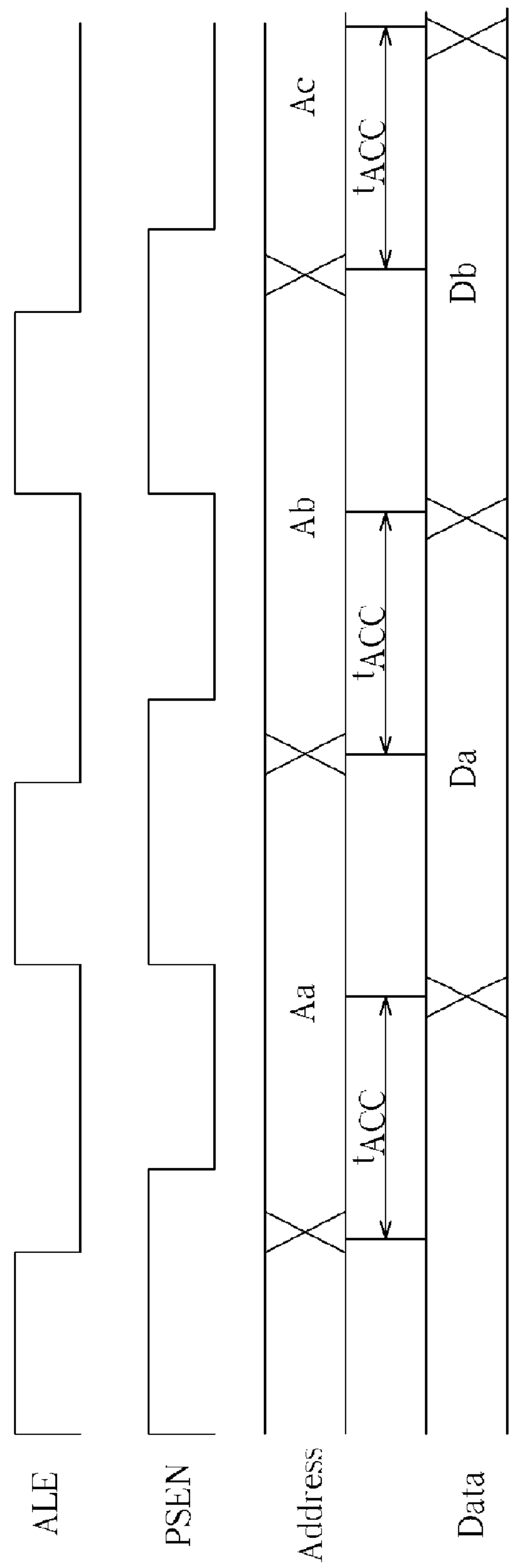
FIG. 3 shows a timing diagram of the flash memory access system reading from standard flash memory.
Figure 4:
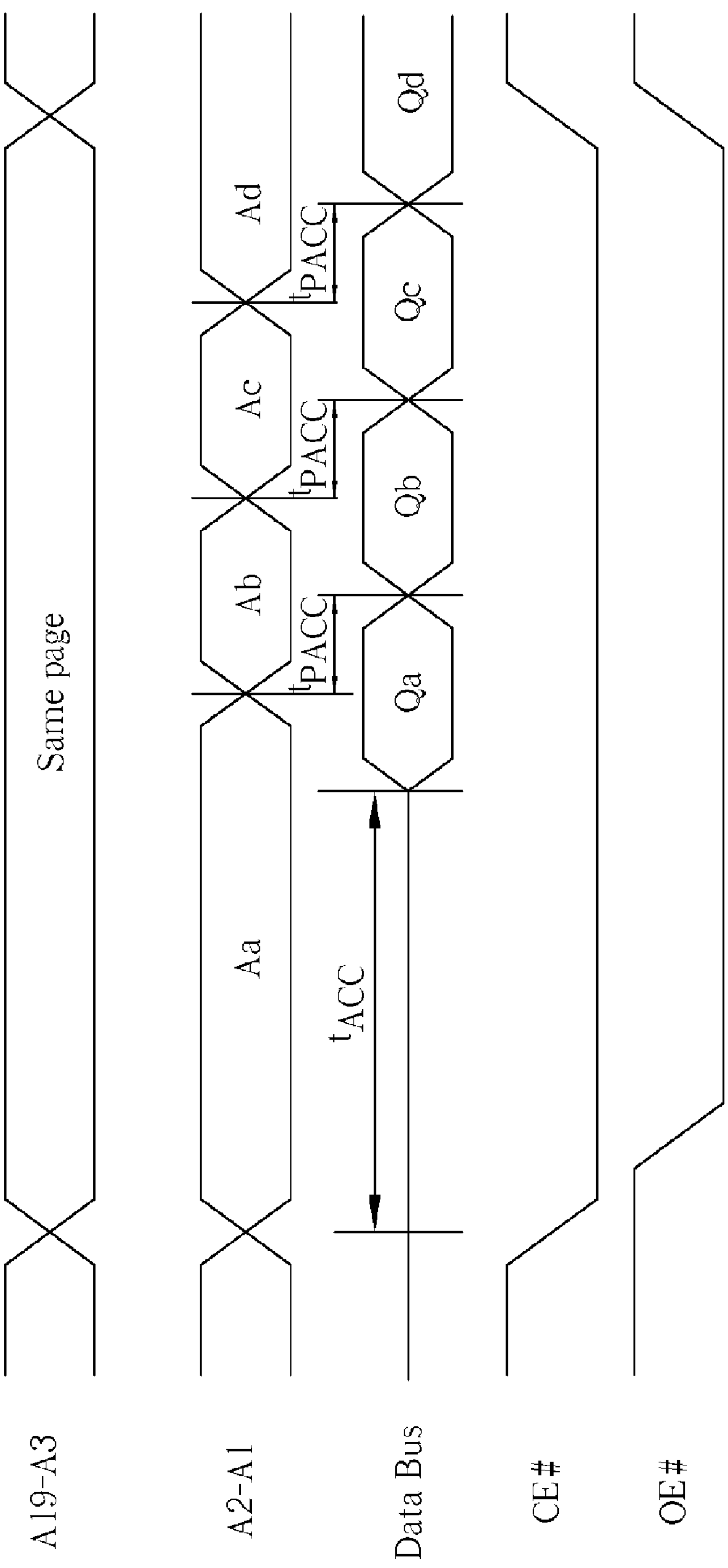
FIG. 4 is a timing diagram showing page mode flash memory read accesses.

Please refer to FIG. 4. FIG. 4 is a timing diagram showing page mode flash memory read accesses. Addresses Aa, Ab, Ac, and Ad correspond to multiple bytes within a same page of page mode flash memory. When accessing the first byte at address Aa, the access time is $t_{ACC}$. When accessing additional bytes of memory at addresses Ab, Ac, and Ad within the same page of memory, the page mode access time is $t_{PACC}$, which is significantly shorter the normal access time $t_{ACC}$.

Figure 5:
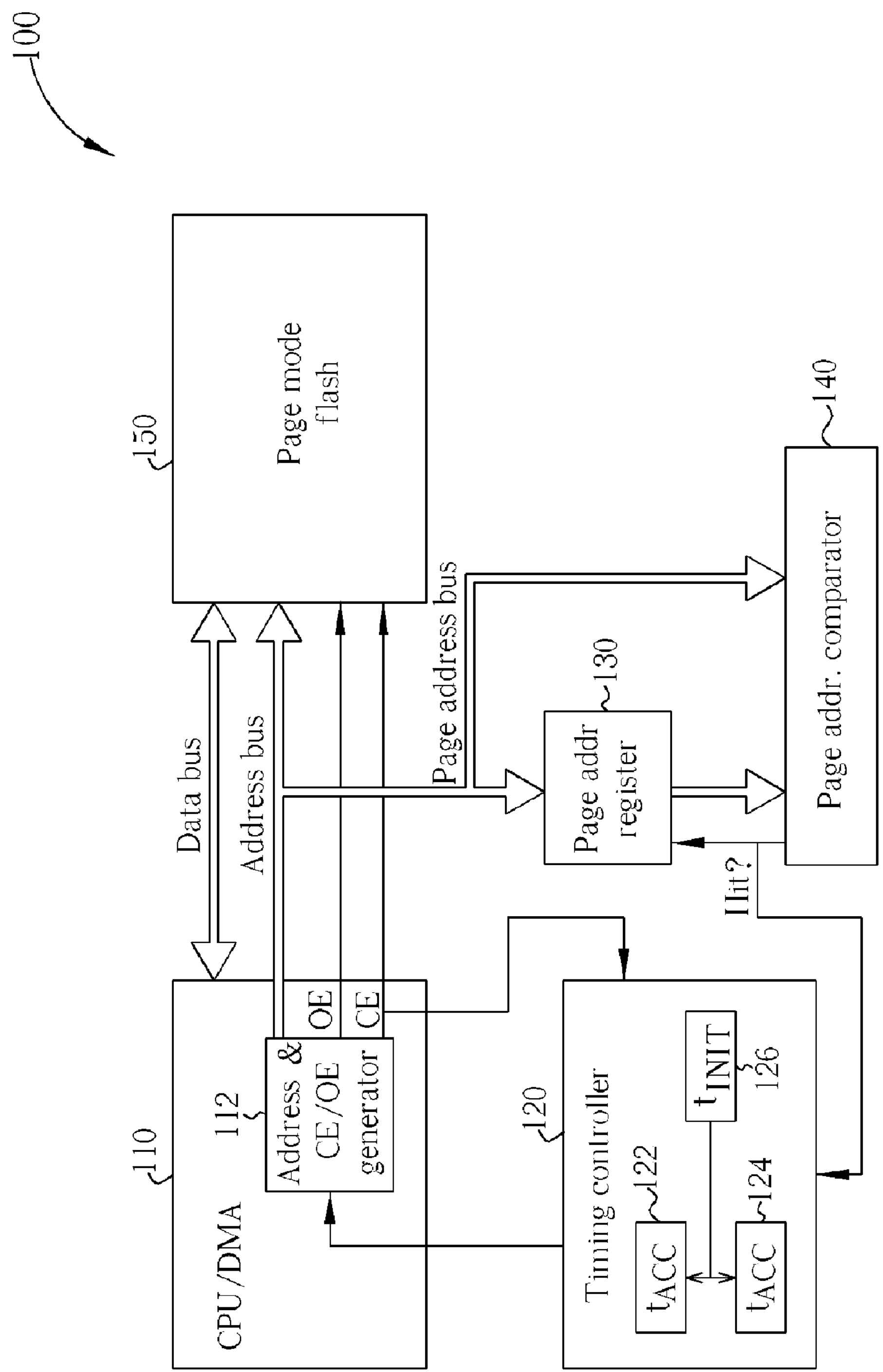
FIG. 5 is a block diagram of an exemplary embodiment of an access system for accessing a page mode flash memory.

Please refer to FIG. 5. FIG. 5 is a block diagram of an exemplary embodiment of an access system 100 for accessing a page mode flash memory 150. The access system is utilized for enabling a CPU or DMA controller 110 to access the page mode flash memory 150. The CPU or DMA controller 110 contains a generating circuit 112 for generating address signals, a chip enable signal CE, and an output enable signal OE and providing these signals to the page mode flash memory 150. The address of the byte (or word) of the page mode flash memory 150 that was previously accessed is stored in a page address register 130. The access system 100 also contains a page address comparator 140 for comparing a target address of the page mode flash memory 150 that is currently being accessed with the previous address stored in the page address register 130. The page address comparator 140 then determines if the target address corresponds to a same page of the page mode flash memory 150 as the previous address. If so, the page address comparator 140 generates a hit. If the target address does not correspond to the same page as the previous address, the page address comparator 140 generates a miss.

The access system 100 contains a timing controller 120 for determining the access time used for the CPU or DMA controller 110 to access the page mode flash memory 150. The timing controller 120 contains a normal access timing register 122 for storing a normal access time $t_{ACC}$, a page mode access timing register 124 for storing a page mode access time $t_{PACC}$, and an initial timing register 126 for storing an initial access time value $t_{INIT}$. At the start, the initial access time value $t_{INIT}$ is stored in the initial timing register 126 and the normal access timing register 122 and the page mode access timing register 124 do not have timing values stored in them. Once the timing parameters of the page mode flash memory 150 are determined, the normal access time $t_{ACC}$ and the page mode access time $t_{PACC}$ are set in the normal access timing register 122 and the page mode access timing register 124, respectively.

The timing controller 120 selects an appropriate access time value according to a variety of factors, as will be explained below with respect to FIG. 6. The timing controller 120 then sends the selected access time value to the generating circuit 112 of the CPU or DMA controller 110 so the CPU or DMA controller 110 can access the page mode flash memory 150 using the most efficient access time possible.

Figure 6:
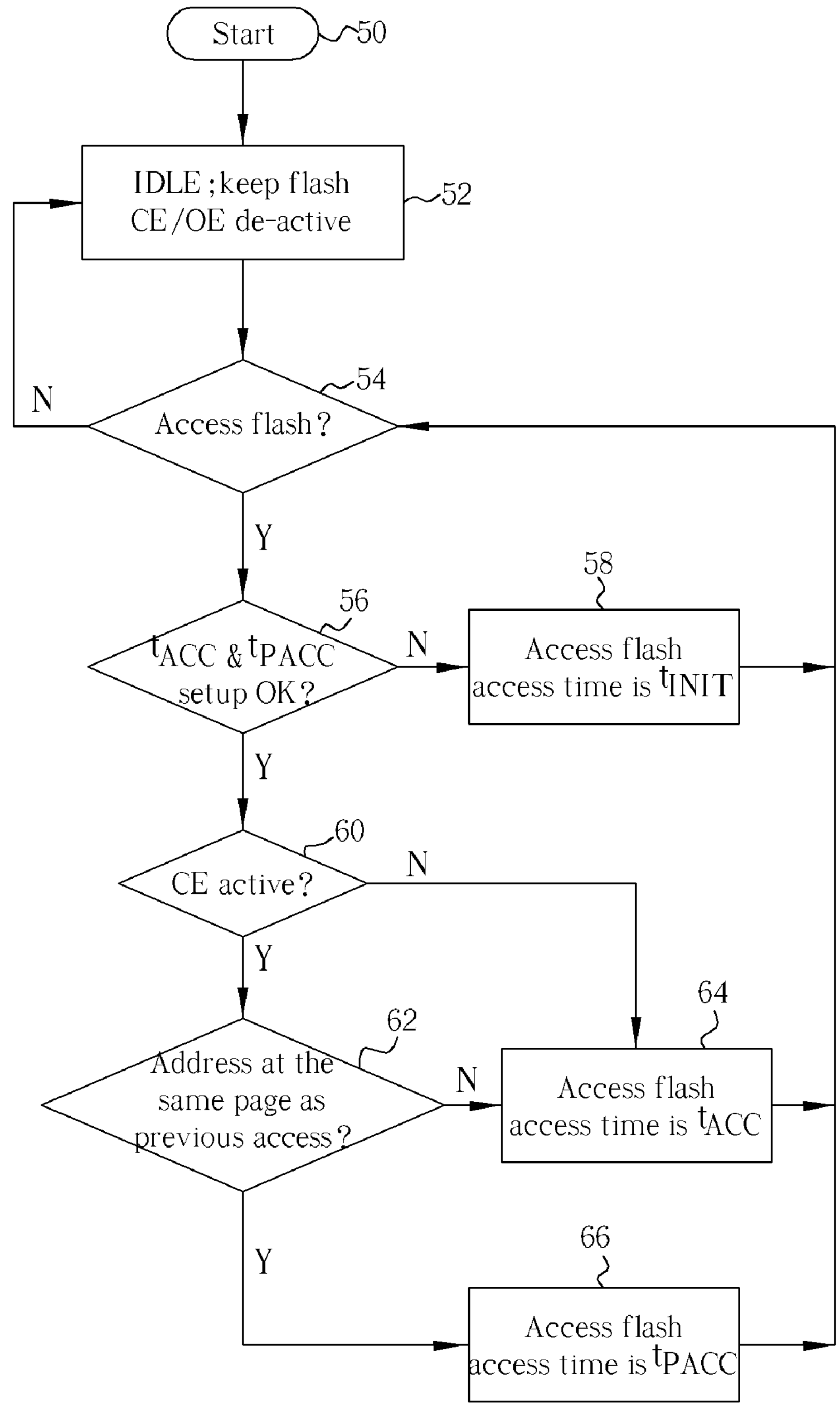
FIG. 6 is a flowchart illustrating an exemplary method of selecting an access time for accessing page mode flash memory.

Please refer to FIG. 6. FIG. 6 is a flowchart illustrating an exemplary method of selecting an access time for accessing page mode flash memory. Steps contained in the flowchart will be explained below.

Step 50: Start;

Step 52: Initially, the CPU or DMA controller 110 is in idle mode. The chip enable signal CE and output enable signal OE are kept inactive to keep the page mode flash memory 150 in standby mode in order to save power;

Step 54: Determine if the CPU or DMA controller 110 starts to access the page mode flash memory 150; if so, go to step 56; if not, go back to step 52;

Step 56: Determine if the normal access time $t_{ACC}$ and the page mode access time $t_{PACC}$ are set in the normal access timing register 122 and the page mode access timing register 124, respectively. If these two access times have not been set yet, go to step 58; if these two access times have been set, go to step 60;

Step 58: The timing controller 120 outputs the initial access time value $t_{INIT}$ stored in the initial timing register 126 to the CPU or DMA controller 110. Since there are many types of flash memory that have different access times, the initial access time value $t_{INIT}$ should be a large value to support all types of flash memory. Typically a value of the initial access time value $t_{INIT}$ greater than 200 ns is sufficient. Go to step 54;

Step 60: The timing controller 120 receives the chip enable signal CE from the generating circuit 112 and determines if the chip enable signal CE is active. If the chip enable signal CE is active, it means that the access system 100 continuously access the page mode flash memory 150, and the same page of memory corresponding to the target address may have already been accessed. If the chip enable signal CE is active, go to step 62; if not, go to step 64;

Step 62: The page address comparator 140 determines if the target address corresponds to a same page of the page mode flash memory 150 as the previous address stored in the page address register 130. That is, the page address comparator 140 determines if there is a hit. If so, go to step 66; if not, go to step 64;

Step 64: The timing controller 120 outputs the normal access time $t_{ACC}$ stored in the normal access timing register 122 to the CPU or DMA controller 110; go to step 54; and Step 66: The timing controller 120 outputs the page mode access time $t_{PACC}$ stored in the page mode access timing register 124 to the CPU or DMA controller 110; go to step 54.

Figure 7:
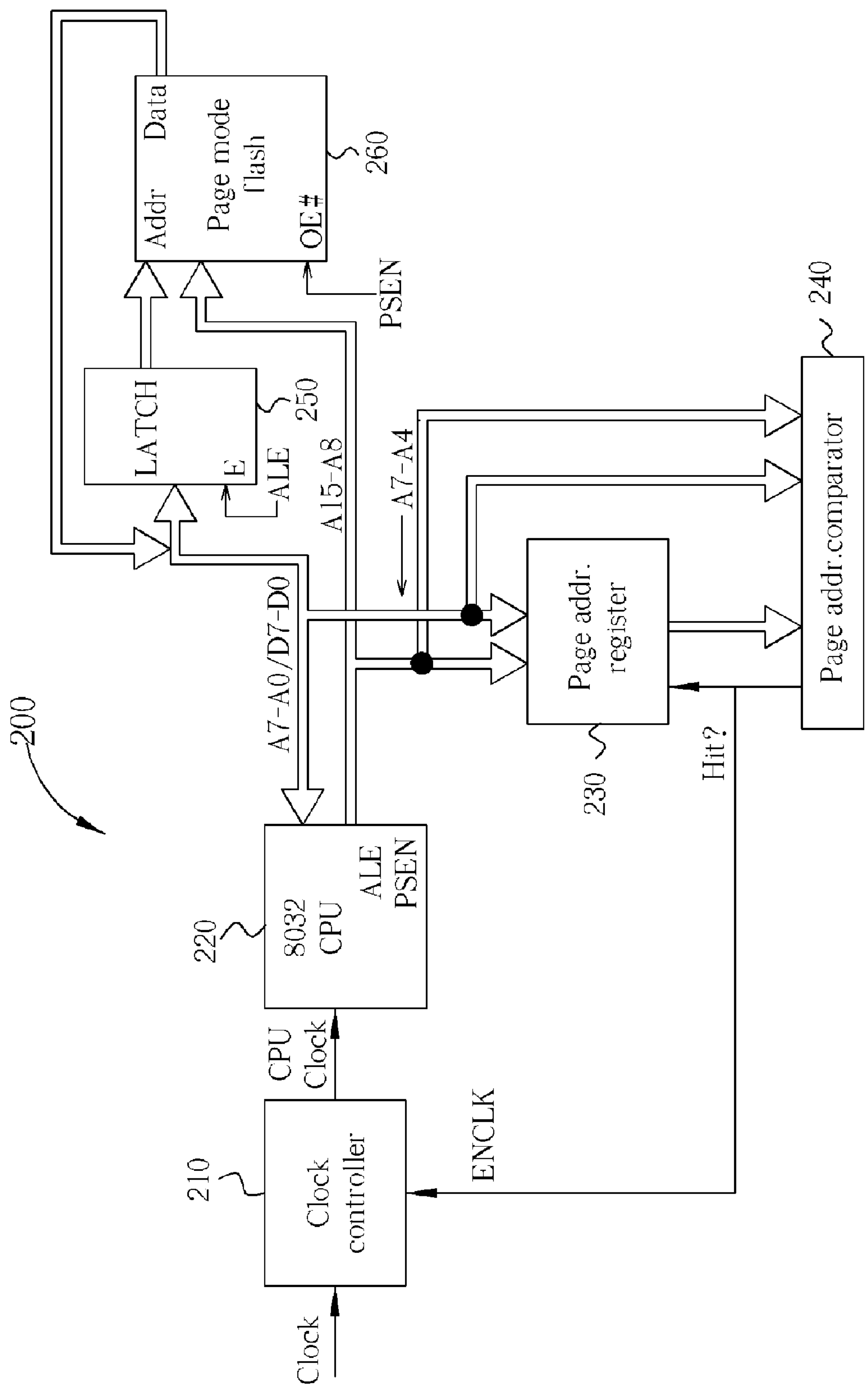
FIG. 7 is a block diagram of an exemplary embodiment of an access system having a clock controller to control the timing of a microprocessor used to access a page mode flash memory.
Figure 8:
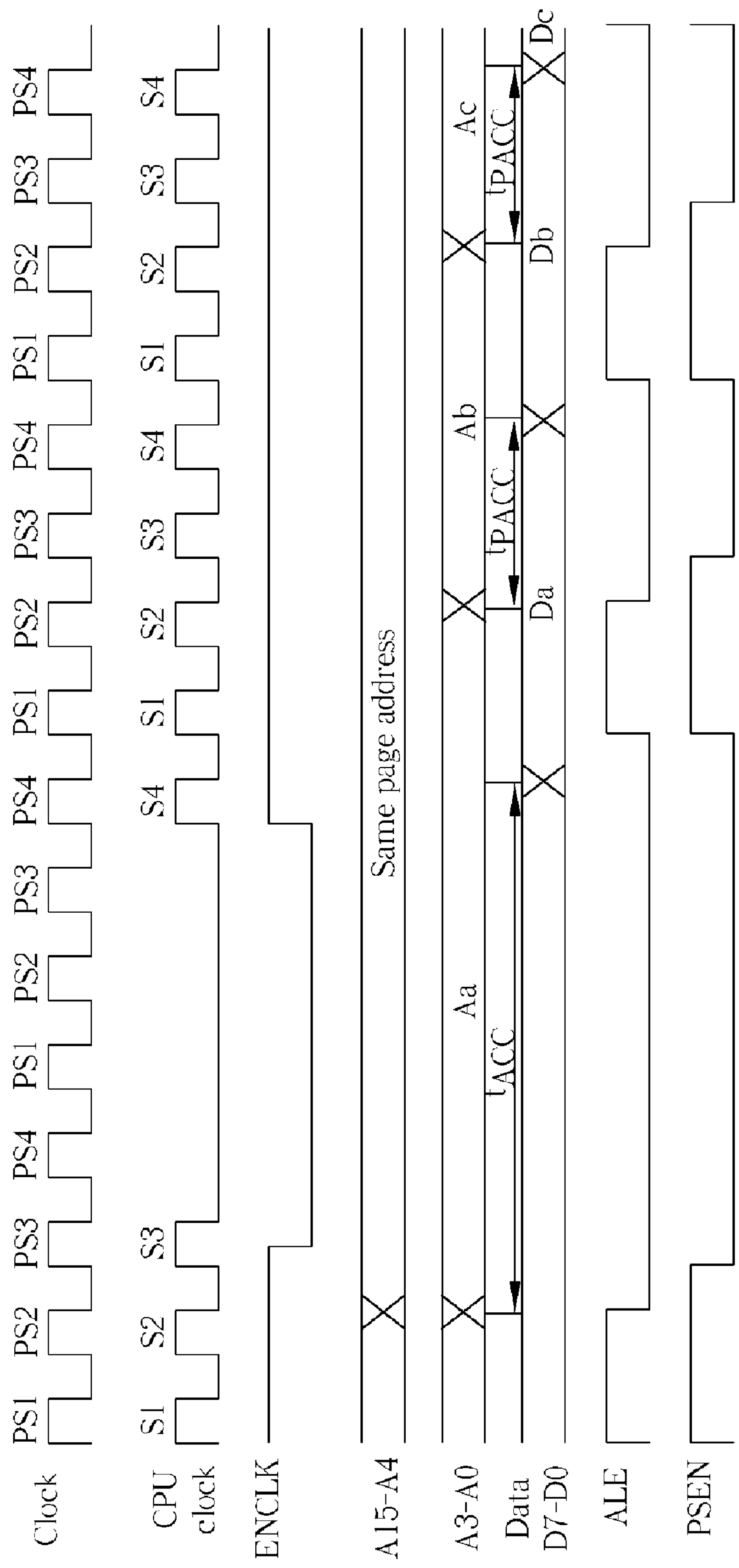
FIG. 8 is a timing diagram of the operation of the access system.

Please refer to FIG. 7 and FIG. 8. FIG. 7 is a block diagram of an exemplary embodiment of an access system 200 having a clock controller 210 to control the timing of a microprocessor 220 used to access a page mode flash memory 260. FIG. 8 is an exemplary timing diagram of the operation of the access system 200. As an example, the microprocessor 220 can be an Intel® 8032 microprocessor. The microprocessor 220 can generate address signals, a chip enable signal CE, and an output enable signal OE for the page mode flash memory 260. The microprocessor 220 outputs an address latch enable single ALE for latching the address in a latch 250, and outputs a program strobe enable signal PSEN for sending data to the page mode flash memory 260. The microprocessor 220 does not have any wait state control signals that allow the microprocessor 220 to create different timing parameters. Therefore, the clock controller 210 is used to create a CPU clock signal based on an input clock signal.

Like the access system 100, the access system 200 also contains a page address register 230 and a page address comparator 240. The page address register 230 stores previous address information, and the page address comparator 240 compares the target address with the previous address stored in the page address register 230 to determine if there is a hit, i.e. if the target address and the previous address correspond to the same page of the page mode flash memory 260. The comparison result performed by the page address comparator 240 controls activation of a clock enable signal ENCLK. If there is a page hit, the clock enable signal ENCLK is activated. If there is not a page hit, the clock enable signal ENCLK is not activated for a longer period of time, as shown in FIG. 8, depending on the specifications of the page mode flash memory 260. The selective activation of the clock enable signal ENCLK controls the access time for accessing the page mode flash memory 260 between the normal access time $t_{ACC}$ and the page mode access time $t_{PACC}$. Each of the access times $t_{ACC}$ and $t_{PACC}$ generated as the CPU clock is a multiple of the clock input to the clock controller 210. The page mode access time $t_{PACC}$ can have the exact same period as the input clock or can have a longer period, according to memory specifications. In this regard, $t_{PACC}$ is equal to kT, where k is an integer. Likewise, when generating the normal access time $t_{ACC}$, the clock enable signal ENCLK is not activated for a period of time nT, where n is an integer and $(n+k)T>t_{ACC}>(n+k-1)T$, in order to control the CPU clock to have an access time greater than the normal access time $t_{ACC}$.

Figure 9:
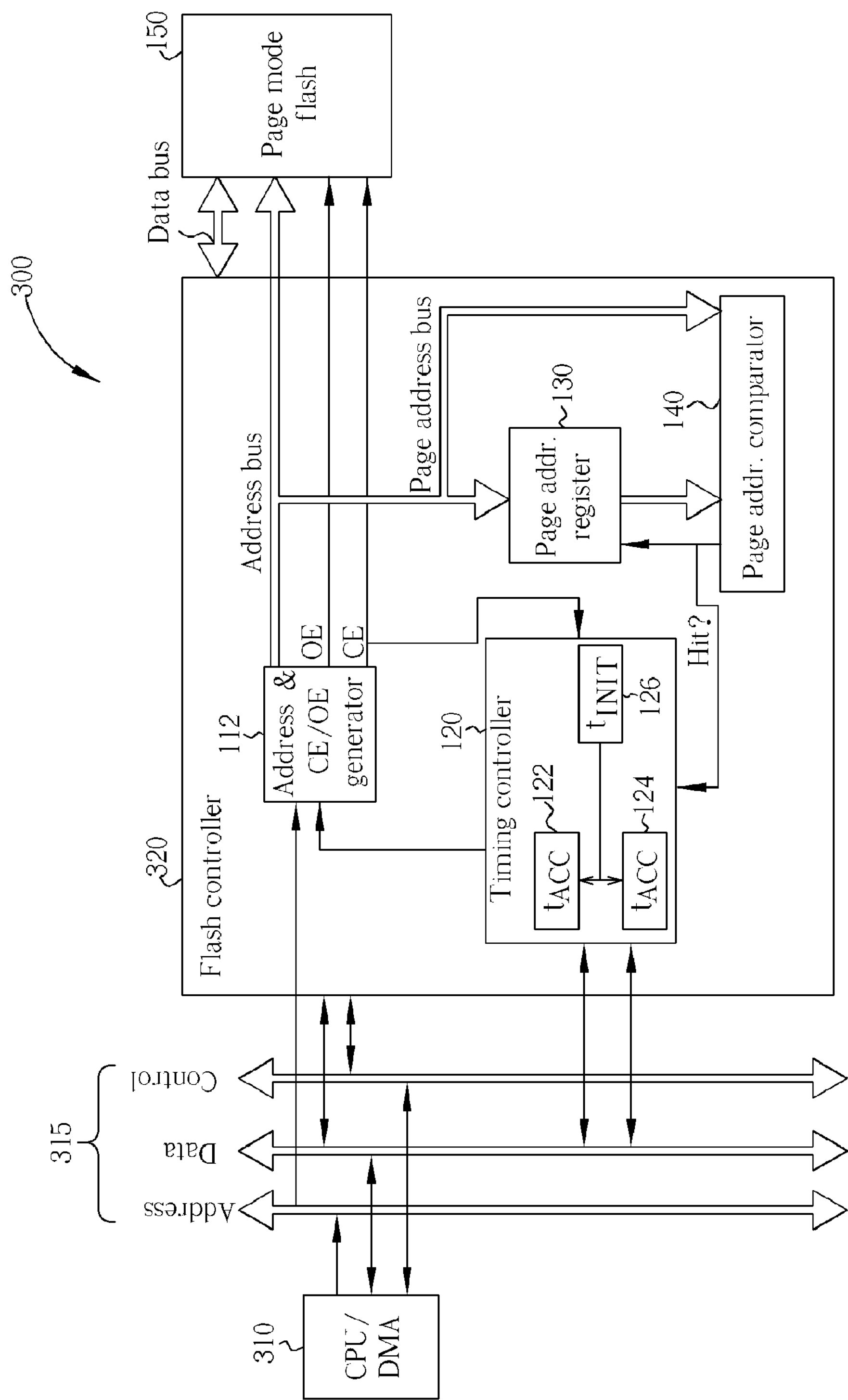
FIG. 9 is a block diagram of an exemplary embodiment of an access system having a flash controller coupled to an internal bus.

Please refer to FIG. 9. FIG. 9 is a block diagram of an exemplary embodiment of an access system 300 having a flash controller 320 coupled to an internal bus 315. In the access system 300, a CPU or DMA controller 310 is coupled to the internal bus 315 and communicates with the flash controller 320 through the internal bus 315. The flash controller 320 receives flash access information from the CPU or DMA controller 310 through the internal bus 315. The normal access timing register 122 and the page mode access timing register 124 have their respective normal access time $t_{ACC}$ and the page mode access time $t_{PACC}$ values initialized via the internal bus 315. As with the access system 100 shown in FIG. 5, the timing controller 120 controls the correct access time $t_{INIT}$, $t_{ACC}$, or $t_{PACC}$ for the page mode flash 150 according to the chip enable signal CE and the page address hit information provided by the page address comparator 140. The CPU or DMA controller 310 sets the timing registers 122, 124 and 126 of the timing controller 120 through the internal bus 315.

The page mode flash memory access systems described provide a method and apparatuses for accessing page mode flash memory at higher speeds than possible before using convention access systems. By comparing the target address of the page mode flash memory with the previous address, the access systems are able to determine if a normal access time must be used or if a page mode access time can be used. Therefore, performance is significantly enhanced when accessing page mode flash memory.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of controlling an access time for accessing a flash memory, the method comprising:

comparing a target address of the flash memory with an address of the flash memory that was previously accessed;

setting the access time for the flash memory to be a first access time if the target address does not correspond to the same page of the flash memory as the previous address; and setting the access time for the flash memory to be a second access time if the target address corresponds to the same page of the flash memory as the previous address;

wherein the first access time is greater than the second access time.

2. The method of claim 1, further comprising:

setting the access time for the flash memory to be the first access time if a chip enable signal for the flash memory is not active irrespective of whether the target address corresponds to the same page of the flash memory as the previous address.

3. The method of claim 1, further comprising:

setting the access time for the flash memory to be an initialization access time if first and second access times have not yet been initialized;

wherein the initialization access time is greater than or equal to the first access time.

4. The method of claim 3, wherein the initialization access time is greater than the first access time.

5. The method of claim 1, further comprising:

controlling a period of a clock generator based on the access time setting.

6. An access system for a flash memory, comprising:

a page address register for storing an address of the flash memory that was previously accessed;

a page address comparator for comparing a target address of the flash memory with the previous address stored in the page address register; and a timing controller for setting an access time for the flash memory to be a first access time if the target address does not correspond to the same page of the flash memory as the previous address and for setting the access time for the flash memory to be a second access time if the target address corresponds to the same page of the flash memory as the previous address;

wherein the first access time is greater than the second access time.

7. The system of claim 6, wherein the timing controller comprises an input port receiving a chip enable signal for the flash memory, the timing controller sets the access time for the flash memory to be the first access time if the target address does not correspond to the same page of the flash memory as the previous address, the timing controller sets the access time for the flash memory to be the first access time if the chip enable signal is not active irrespective of whether the target address corresponds to the same page of the flash memory as the previous address, and the timing controller sets the access time for the flash memory to be the second access time if the target address corresponds to the same page of the flash memory as the previous address and if the chip enable signal is active.

8. The system of claim 6, wherein the timing controller is a clock controller which controls a period of a clock provided to a central processing unit (CPU) based on the access time setting.

9. The system of claim 6, further comprising:

an initial timing register for storing an initialization access time, the timing controller setting the access time for the flash memory to be the initialization access time if the first and second access times have not yet been initialized;

wherein the initialization access time is greater than or equal to the first access time.

10. The system of claim 9, wherein the initialization access time is greater than the first access time.

11. A flash controller coupled to an internal bus of an integrated circuit, the flash controller comprising:

a flash address generator for generating an address of a flash memory;

a chip enable signal generator;

a page address register coupled to the flash address generator for storing an address of the flash memory that was previously accessed;

a page address comparator for comparing a target address of the flash memory with the previous address stored in the page address register; and a timing controller coupled to the chip enable signal generator for setting an access time for the flash memory to be a first access time if the target address does not correspond to the same page of the flash memory as the previous address and for setting the access time for the flash memory to be a second access time if the target address corresponds to the same page of the flash memory as the previous address;

wherein the first access time is greater than the second access time.

12. The flash controller of claim 11, wherein the timing controller comprises an input port receiving a chip enable signal generated by the chip enable signal generator, the timing controller sets the access time for the flash memory to be the first access time if the target address does not correspond to the same page of the flash memory as the previous address, the timing controller sets the access time for the flash memory to be the first access time if the chip enable signal is not active irrespective of whether the target address corresponds to the same page of the flash memory as the previous address, and the timing controller sets the access time for the flash memory to be the second access time if the target address corresponds to the same page of the flash memory as the previous address and if the chip enable signal is active.

13. The flash controller of claim 11, further comprising:

15 an initial timing register for storing an initialization access time, the timing controller setting the access time for the flash memory to be the initialization access time if the first and second access times have not yet been initialized;

wherein the initialization access time is greater than or equal to the first access time.

14. The flash controller of claim 13, wherein the initialization access time is greater than the first access time.

* * * * *